US011640212B2

(12) United States Patent
Zha et al.

(10) Patent No.: US 11,640,212 B2
(45) Date of Patent: May 2, 2023

(54) CONTROL COMPONENT, DISPLAY SCREEN, AND CONTROL DEVICE

(71) Applicant: Shenzhen China Star Optoelectronics Semiconductor Display Technology Co., Ltd., Guangdong (CN)

(72) Inventors: Bao Zha, Guangdong (CN); Miao Jiang, Guangdong (CN); Jiangbo Yao, Guangdong (CN); Xin Zhang, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 309 days.

(21) Appl. No.: 17/056,038

(22) PCT Filed: Oct. 27, 2020

(86) PCT No.: PCT/CN2020/123960
§ 371 (c)(1),
(2) Date: Nov. 17, 2020

(87) PCT Pub. No.: WO2022/077555
PCT Pub. Date: Apr. 21, 2022

(65) Prior Publication Data
US 2022/0308692 A1    Sep. 29, 2022

(30) Foreign Application Priority Data

Oct. 15, 2020  (CN) .......................... 202011101731.7

(51) Int. Cl.
*G06F 3/041*       (2006.01)
*G02F 1/1333*      (2006.01)
(Continued)

(52) U.S. Cl.
CPC ........ *G06F 3/0412* (2013.01); *G02F 1/13338* (2013.01); *G06F 3/0443* (2019.05);
(Continued)

(58) Field of Classification Search
None
See application file for complete search history.

(56) References Cited

U.S. PATENT DOCUMENTS 9,990,079 B2 *  6/2018  Gu .......................... G06F 3/042
2008/0024414 A1 * 1/2008  Shih ..................... G06F 3/0416
                                                        345/92

(Continued)

FOREIGN PATENT DOCUMENTS

CN       104699344 B  * 11/2017  .......... G06F 3/0412
CN       110286796       9/2019
(Continued)

*Primary Examiner* — Duane N Taylor, Jr.

(57) ABSTRACT

The present application provides a control component, a display screen, and a control device. The control component is integrated in a display screen and includes a substrate and a light control structure and a touch control structure arranged side by side on the substrate; the light control structure includes a signal input line, a signal output line, and a photosensitive circuit electrically connected between the signal input line and the signal output line; the touch control structure includes a plurality of receiving electrodes and a plurality of transmitting electrodes; and the receiving electrodes are multiplexed as the signal output line.

18 Claims, 6 Drawing Sheets

(51) Int. Cl.
  *H01L 27/12* (2006.01)
  *H01L 29/786* (2006.01)
  *H01L 31/113* (2006.01)
  *G06F 3/044* (2006.01)

(52) U.S. Cl.
  CPC ........ *H01L 27/124* (2013.01); *H01L 27/1255* (2013.01); *H01L 29/78633* (2013.01); *H01L 31/113* (2013.01)

(56) References Cited

U.S. PATENT DOCUMENTS

| | | |
|---|---|---|
| 2014/0210736 A1 | 7/2014 | Jeon |
| 2015/0029421 A1* | 1/2015 | Gu .................. G06F 3/0412 349/12 |
| 2020/0103995 A1 | 4/2020 | Den Boer et al. |

FOREIGN PATENT DOCUMENTS

| | | | |
|---|---|---|---|
| CN | 110471554 A * | 11/2019 | ......... G02F 1/13338 |
| CN | 111381409 | 7/2020 | |
| CN | 111381711 | 7/2020 | |
| CN | 111524917 | 8/2020 | |
| CN | 111696494 | 9/2020 | |

* cited by examiner

CONTROL COMPONENT, DISPLAY SCREEN, AND CONTROL DEVICE

RELATED APPLICATIONS

This application is a National Phase of PCT Patent Application No. PCT/CN2020/123960 having International filing date of Oct. 27, 2020, which claims the benefit of priority of Chinese Patent Application No. 202011101731.7 filed on Oct. 15, 2020. The contents of the above applications are all incorporated by reference as if fully set forth herein in their entirety.

FIELD AND BACKGROUND OF THE INVENTION

The present application relates to the field of display, in particular to a control component, a display screen and a control device.

Display screens on the market, especially small and medium-sized display screens, are usually integrated with touch functions. However, a display screen integrated with a touch function can only achieve short-range control, and with the development of human-computer interaction, this kind of display screen cannot meet actual needs.

SUMMARY OF THE INVENTION

In view of this, an object of the present application is to provide a control component, a display screen, and a control device, which are integrated with touch functions and light control functions.

The present application provides a control component, wherein the control component is integrated in a display screen and includes a substrate and a light control structure and a touch control structure arranged side by side on the substrate; the light control structure includes a signal input line, a signal output line, and a photosensitive circuit electrically connected between the signal input line and the signal output line; the touch control structure includes a plurality of receiving electrodes and a plurality of transmitting electrodes; and the receiving electrodes are multiplexed as the signal output line.

In an embodiment of the present application, the photosensitive circuit includes a photosensitive transistor; the light control structure includes a first gate, a first source, a first drain, and a first active layer corresponding to the first gate and disposed between the first source and the first drain; the photosensitive circuit includes a first scan line; the first gate is connected to the first scan line; and the first source is connected to the signal input line.

In an embodiment of the present application, the first drain of the photosensitive transistor is connected to the signal output line.

In an embodiment of the present application, the photosensitive circuit further includes a switch transistor; a light control structure further includes a second scan line; and the switch transistor includes a second gate, a second source, a second drain, and a second active layer corresponding to the second gate and disposed between the second source and the second drain; the second gate is connected to the second scan line; the second source is connected to the first drain; and the second drain is connected to the signal output line.

In an embodiment of the present application, the transmitting electrodes and the second gate are arranged in a same layer, and the receiving electrodes and the second drain are arranged in a same layer.

In an embodiment of the present application, the first active layer and the second active layer are arranged in a same layer and made of a same material, and a material of each of the first active layer and the second active layer includes a photosensitive semiconductor, and the switch transistor further includes a light-shielding layer arranged on a side of the second active layer away from the substrate and corresponding to the second active layer.

In an embodiment of the present application, the photosensitive circuit further includes a storage capacitor, a first plate of the storage capacitor is connected to the first drain, and a second plate is connected to the first scan line.

In an embodiment of the present application, the photosensitive circuit further includes a storage capacitor, a first plate of the storage capacitor is connected between the first drain and the second source, and the second electrode plate is connected to the first scan line.

In an embodiment of the present application, the light control structure includes the first electrode layer disposed on the substrate, a semiconductor layer disposed on the first electrode layer, a second electrode layer disposed on the semiconductor layer, and the light-shielding layer disposed on the semiconductor layer; the transmitting electrodes are disposed in a same layer as one of the first electrode layer, the second electrode layer, and the light-shielding layer; and the receiving electrodes are disposed in a same layer as another one of the first electrode layer, the second electrode layer, and the light-shielding layer.

In an embodiment of the present application, the control component further includes a drive structure, the light control structure and the touch control structure are electrically connected to the drive structure, and the drive structure is configured to time-sharing drive the light control structure and the touch control structure.

The present application provides a display screen, which includes a display panel and a control component attached to a display side of the display panel, wherein the control component is the above-mentioned control component.

The present application also provides a control device, which includes the above-mentioned display screen and a light-emitting component, using the display screen according to claim 11 and a light-emitting component, the light-emitting component is configured to emit light to the display screen, and the control component of the display screen is configured to detect a position where the light emitted by the light-emitting component enters the display screen.

The present application uses an on-glass structure integrated with a light control structure and a touch control structure, such that both the light control and touch functions can be simultaneously integrated into the display screen to realize the functions of short-range touch and remote light control, and lack of the single-function touch or light control is made up for. It is particularly conducive to the simultaneous realization of light control and touch functions of a large-size display screen.

BRIEF DESCRIPTION OF THE SEVERAL VIEWS OF THE DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

DESCRIPTION OF SPECIFIC EMBODIMENTS OF THE INVENTION

Figure 1:
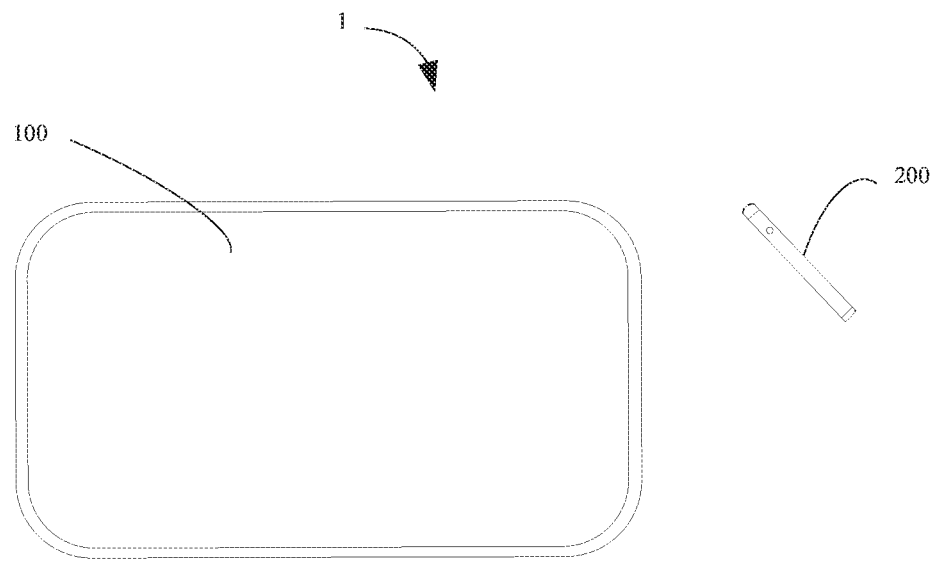
FIG. 1 is a schematic diagram of a control device provided by Embodiment 1 of the present application.

It should be noted that, in the description of this application, it should be understood that the terms "upper", "lower", "front", "back", "left", "right", "inner", "outer", and the like are based on the orientation or positional relationship shown in the drawings, and is merely for the convenience of describing the present invention and simplifying the description, and does not indicate or imply that the indicated devices or components must to be in particular orientations, or constructed and operated in a particular orientation, and thus are not to be construed as limiting the invention.

In the description of this application, it should be noted that the terms "installation", "connected", and "connected" should be understood in a broad sense unless explicitly stated and limited otherwise. For example, it can be a fixed connection, a detachable connection, or an integral connection; it can also be a mechanical connection or an electrical connection; it can be a direct connection; or it can be an indirect connection through an intermediate medium; or it can be a communication between two components.

Referring to FIG. 1, the present application provides a control device 1, which includes a display screen 100 and a light-emitting component 200. The light-emitting component 200 is configured to emit light to the display screen 100, and the display screen 100 is configured to detect a position where the light emitted by the light-emitting component 200 enters the display screen 100.

The display screen 100 according to various embodiments of the present invention may, for example, include at least one of a smart phone, a tablet personal computer, a mobile phone, a video phone, an e-book reader, a desktop PC, a laptop PC, a netbook computer, a workstation, a server, or a personal digital assistant.

The display screen 100 may be an active light-emitting display, such as an organic light-emitting diode (OLED) display, an active-matrix organic light-emitting diode (AMOLED) display, and a passive matrix organic light-emitting diode (PMOLED) display, quantum dot light-emitting diode (QLED) display, a micro light-emitting diode (Micro-LED) display, a mini light-emitting diode (Mini-LED) display screen, etc.; or it can also be a passive light-emitting display, such as a liquid crystal display (LCD) device.

The light-emitting component 200 may be a laser pointer. The light-emitting component 200 can emit visible light and infrared light. In one embodiment, the detectable wavelength range ranges from 380 nm to 850 nm.

Figure 2:
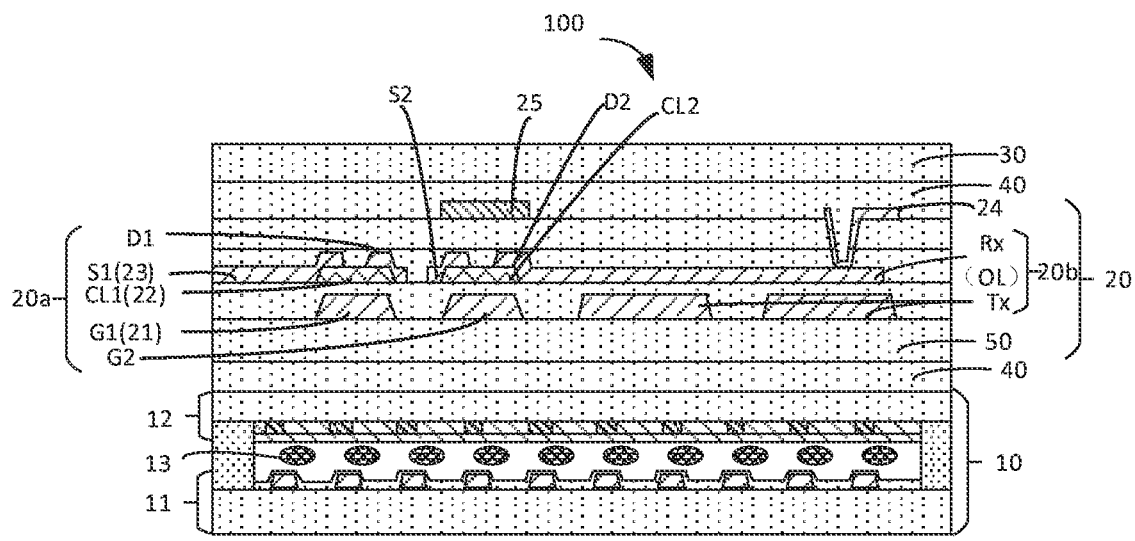
FIG. 2 is a partial cross-sectional view of the display screen provided by Embodiment 1 of the present application.
Figure 3:
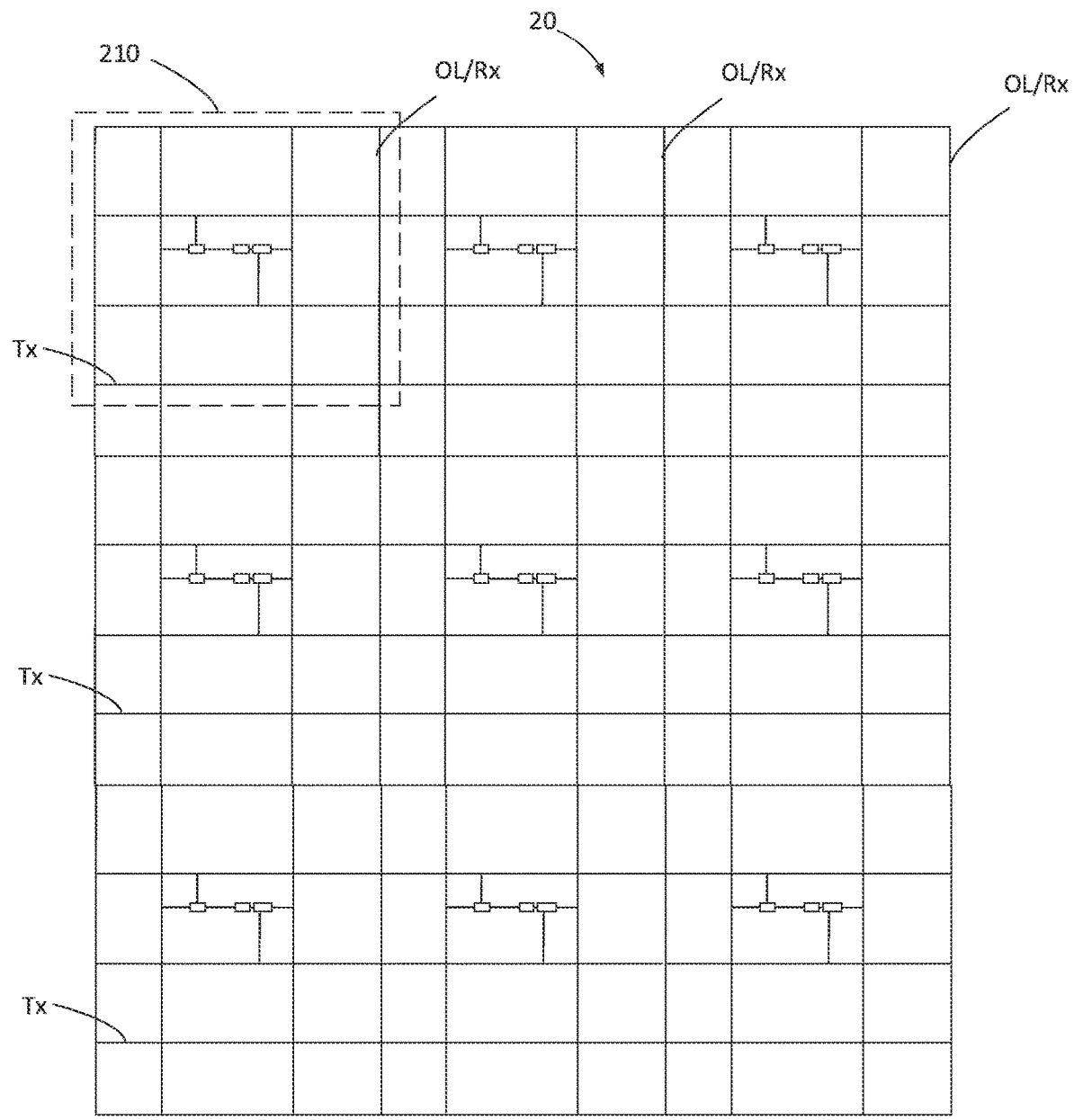
FIG. 3 is a schematic top view of the control component of the display screen provided by Embodiment 1 of the present application.
Figure 4:
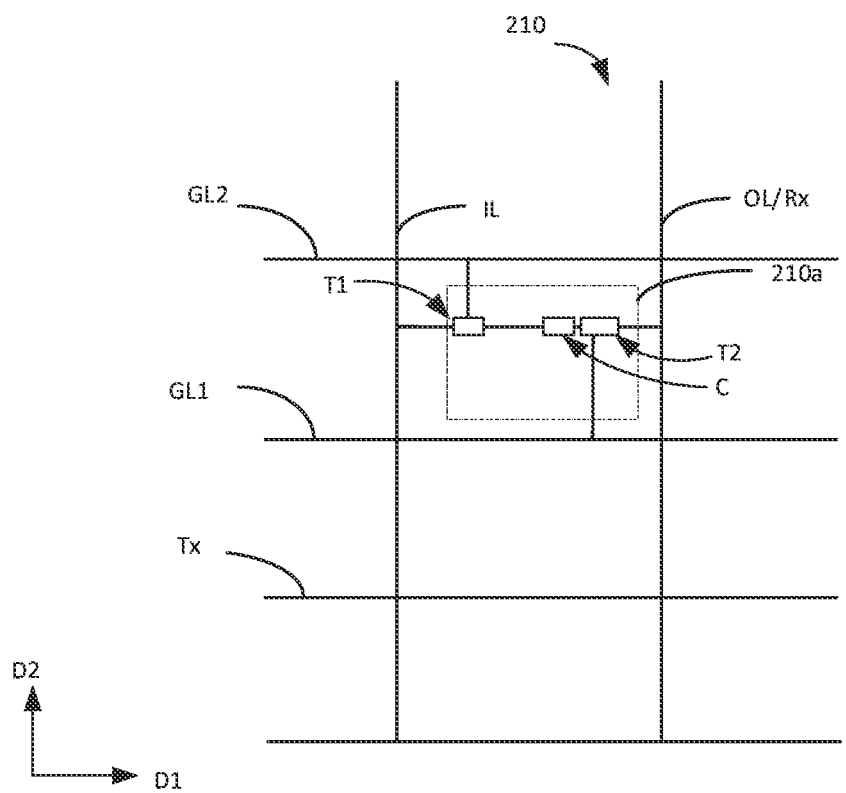
FIG. 4 is a schematic top view of a control unit in FIG. 2.

Referring to FIGS. 2 to 4 together, the display screen 100 includes a display panel 10, a control component 20 attached to a display side of the display panel 10, and a cover glass 30 covering a side of the control component 20 away from the display panel 10. Between the display panel 10 and the control component 20, the control component 20 and the cover glass 30 can be bonded to each other by an optical adhesive 40. Thus, a display screen integrated with display and control functions is formed. The display screen 100 of the present application may be a small-medium sized display screen, or a large-sized display screen.

In the present application, the display screen 100 is a liquid crystal display screen. The display panel 10 is a liquid crystal display panel. In the present application, a type of the liquid crystal display panel 10 is not particularly limited, which may be a vertical electric field type liquid crystal display panel, such as a twisted nematic (TN) type liquid crystal display panel, and a multi-domain vertical alignment (MVA) type liquid crystal display panel. The liquid crystal display panel may also be a horizontal electric field liquid crystal display panel, such as a fringe field switching (FFS) liquid crystal display panel or an in-plane switching (IPS) liquid crystal display panel.

The liquid crystal display panel 10 includes an array substrate 11 and an opposite substrate 12, and a liquid crystal layer 13 disposed between the array substrate 11 and the opposite substrate 12. In this embodiment, the array substrate 11 is an array substrate, and the opposite substrate 12 is a color filter substrate. In the present application, types of the array substrate 11 and the opposite substrate 12 are not particularly limited either. In other embodiments of the present application, the array substrate 11 and the opposite substrate 12 may be COA (color filter on array) type array substrate and opposite substrate. The cover glass 30 may be, for example, transparent glass or transparent plastic.

A control module 20 is disposed between the display panel 10 and the cover plate 30. The control module 20 includes a substrate 50 and a light control structure 20a and a touch control structure 20b disposed on the substrate 50. The light emitted by the light-emitting component 200 is irradiated to the display screen 100, and is detected by the light control structure 20a to determine the position of the light. In one embodiment, the light control structure 20a is configured to detect visible light and infrared light, and the wavelength it can detect ranges from 380 nm to 850 nm. The light control structure 20a can be used together with the light-emitting component 200. The touch structure 20b is a module for detecting a user's touch action. In the present application, the touch structure 20b is a capacitive touch structure. In one embodiment, the display screen 100 includes a display area and a non-display area. The light control structure 20a and the touch control structure 20b are arranged throughout the entire display area.

As shown in FIG. 3, the control component 20 includes a plurality of control units 210. FIG. 3 only shows a total of nine control units 210 in three rows and three columns, but a number of control units 210 in the present application is not particularly limited thereto. Each of the control units 210 is integrated with a minimum unit of the light control structure 20a and a minimum unit of the touch structure 20b.

As shown in FIG. 4, the light control structure 20a includes a plurality of photosensitive circuits 210a. Each control unit 210 includes a photosensitive circuit 210a. In this embodiment, the photosensitive circuit 210a is a 2T1C circuit. That is, a circuit composed of two Thin Film Transistors (TFTs), a photosensitive transistor T1, a switch transistor T2, and a storage capacitor C.

In addition, in the present application, the specific circuit structure of the photosensitive circuit 210a is not particularly limited, as long as the photosensitive detection can be completed. For example, the circuit structure of the photosensitive sensor can also be three-transistor and one-capacitor (3T1C), four-transistor and one-capacitor (4T1C), or five-transistor and one-capacitor (5T1C).

The photosensitive transistor T1 includes a first gate G1, a first source S1, a first drain D1, and a first active layer CL1 corresponding to the first gate G1 and disposed between the first source S1 and the first drain D1. The switch transistor T2 includes a second gate G2, a second source S2, a second drain D2, and a second active layer CL2 corresponding to the second gate G2 and disposed between the second source S2 and the second drain D2. It should be noted that the partial cross-sectional view of FIG. 1 only shows the structure of the photosensitive transistor T1 and the switch transistor T2, and the storage capacitor C is not shown.

The first active layer CL1 of the photosensitive transistor T1, or the photosensitive semiconductor, may be made of a material including amorphous silicon, poly(3-hexylthiophene) (P3HT), and/or the like. P3HT is an organic material with both photosensitive and semiconductor properties. The second active layer CL2 of the switch transistor T2 may be made of a material including amorphous silicon (a-Si:H), polysilicon (low temperature polysilicon and high temperature polysilicon), oxide semiconductor (e.g. IGZO), and/or the like. That is, the material may include a photosensitive semiconductor material or a non-photosensitive semiconductor material.

In this embodiment, both the first active layer CL1 and the second active layer CL2 are amorphous silicon. In addition, the first active layer CL1 and the second active layer CL2 are disposed in the same layer. The first active layer CL1 and the second active layer CL2 can be manufactured with the same material in the same manufacturing step to reduce the manufacturing process. When the material of the second active layer CL2 includes a photosensitive semiconductor material, the control component 20 further includes a light-shielding layer 25. The light-shielding layer 25 is disposed on a side of the second active layer CL2 away from the substrate 50. The light-shielding layer 25 is disposed corresponding to the second active layer CL2 of the switch transistor T2 to prevent light from impacting the switch transistor T2. The light-shielding layer 25 may be made of metal or black ink.

The touch structure 20b is a mutual capacitive touch structure 20b. The touch structure 20b includes a plurality of receiving electrodes Rx and a plurality of transmitting electrodes Tx. The plurality of transmitting electrodes Tx extend along a first direction D1 and are arranged at intervals in the second direction D2. The plurality of receiving electrodes Rx extend along the second direction D2 and are arranged at intervals in the first direction D1. Each of the receiving electrodes Rx is electrically connected to a signal output terminal of the photosensitive circuit 210a, that is, each of the receiving electrodes Rx of the touch structure 20b is multiplexed as the signal output line OL of the light control structure 20a. Through such multiplexing, a structure of the control module 20 can be simplified.

On the other hand, the light control structure 20a can be divided into a first electrode layer 21 disposed on the substrate 50, a semiconductor layer 22 disposed on the first electrode layer 21, a second electrode layer 23 disposed on the semiconductor layer 22, and a third electrode layer 24 and a light-shielding layer 25 disposed on the semiconductor layer 22. The light-shielding layer 25 is provided corresponding to the second active layer CL2 of the switch transistor T2. The third electrode layer 24 and the light-shielding layer 25 may be disposed in the same layer or in different layers. The first electrode layer 21 and the second electrode layer 23 are separated by an insulating layer. The semiconductor layer 22, the second electrode layer 23, and the third electrode layer 24 are separated by insulating layers. The transmitting electrodes Tx may be disposed in the same layer as one of the first electrode layer 21, the second electrode layer 23, and the light-shielding layer 25. The receiving electrodes Rx may be disposed in the same layer as another one of the first electrode layer 21, the second electrode layer 23, and the light-shielding layer 25.

In this embodiment, the transmitting electrodes Tx and the first electrode layer 21 are disposed in the same layer. The receiving electrodes Rx and the second electrode layer 23 are arranged in the same layer. The first electrode layer 21 and the second electrode layer 23 may be made of metal. The third electrode layer may be made of indium tin oxide. The receiving electrodes Rx and the transmitting electrodes Tx can be made of a metal, such as gold (Au), silver (Ag), copper (Cu), aluminum (Al), molybdenum (Mo), magnesium (Mg), tungsten (W), and an alloy thereof; or they can also be made of a transparent conductive material, such as a transparent conductive metal oxide, such as indium tin oxide (ITO), indium zinc oxide (IZO), zinc oxide (ZnO), oxide Zinc aluminum (AZO), and so on.

In a specific embodiment, the first electrode layer 21 includes a first gate G1 and a second gate G2. The semiconductor layer 22 includes a first active layer CL1 and a second active layer CL2. The second electrode layer 23 includes a first source S1, a first drain D1, a second source S2, and a second drain D2. The third electrode layer 24 includes a peripheral wiring of the receiving electrodes Rx. The peripheral wiring of the receiving electrodes Rx is electrically connected to each of the receiving electrodes Rx through a through hole opened in the insulating layer. The transmitting electrodes Tx may be disposed in the same layer as one of the second gate G2, the second drain D2, and the light-shielding layer 25. The receiving electrodes Rx are disposed in the same layer as another one of the second gate G2, the second drain D2, and the light-shielding layer 25. It should be noted that the transmitting electrodes Tx and the receiving electrodes Rx are arranged in different layers.

In a specific embodiment, the plurality of receiving electrodes Rx are electrically connected to the second drain D2 of the switch transistor T2 and arranged in the same layer. The plurality of transmitting electrodes Tx and the second gate G2 of the switch transistor are insulated from each other and arranged in the same layer.

In this embodiment, an example in which the switch transistor is a bottom-gate transistor is demonstrated. In other embodiments of the present application, the switch transistor may also be another type of transistor, such as a top-gate transistor, a double-gate transistor, etc. When the switch transistor is a bottom-gate transistor, the light-shielding layer 25 may be disposed between the substrate 50 and the first electrode layer 21.

Figure 5:
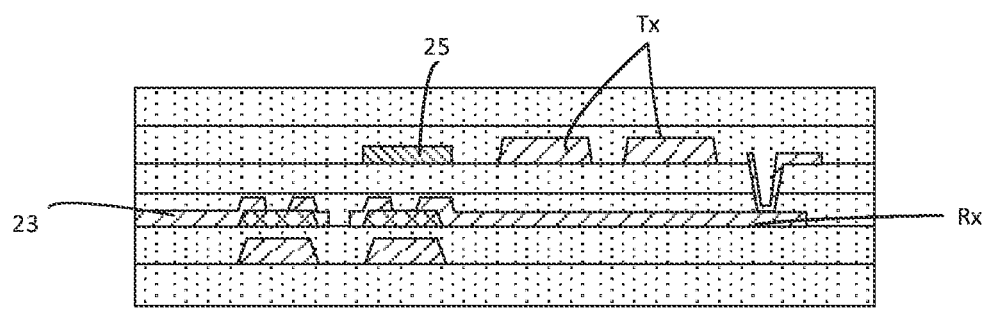
FIG. 5 is a partial cross-sectional view of a display screen provided by another embodiment of the present application.
Figure 6:
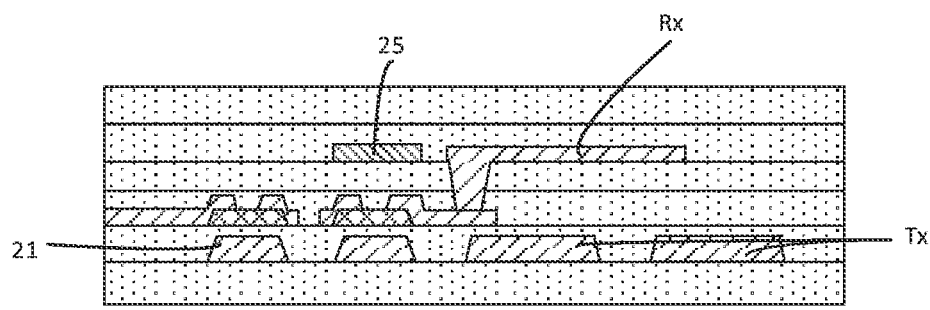
FIG. 6 is a partial cross-sectional view of a display screen provided by another embodiment of the present application.
Figure 7:
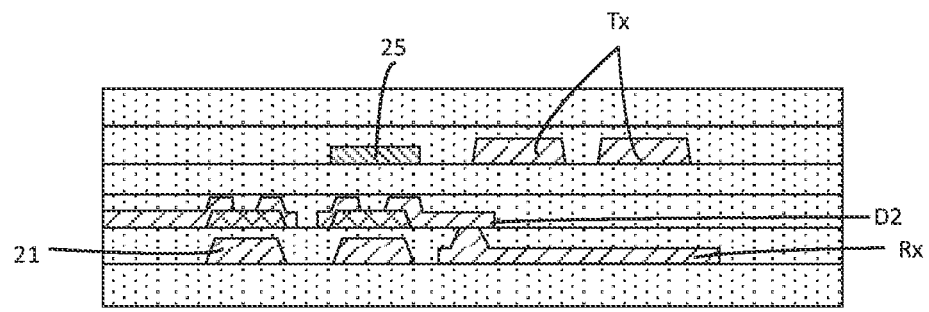
FIG. 7 is a partial cross-sectional view of a display screen provided by still another embodiment of the present application.

In other embodiments of the present application, referring to FIG. 5, the transmitting electrodes Tx and the light-shielding layer 25 are arranged in the same layer, and the receiving electrodes Rx and the second electrode layer 23 are arranged in the same layer and electrically connected. Referring to FIG. 6, the transmitting electrodes Tx and the first electrode layer 21 are arranged in the same layer, and the receiving electrodes Rx and the light-shielding layer 25 are arranged in the same layer, and are electrically connected to the second drain electrode D2 by opening a via hole in the insulating layer. Referring to FIG. 7, the transmitting electrode Tx and the light-shielding layer 25 are arranged in the same layer, and the receiving electrode Rx is arranged in the same layer as the first electrode layer 21 and is electrically connected to the second drain electrode D2 by a via hole opened in the insulating layer. In addition, other embodiments are not listed herein for brevity.

Figure 8:
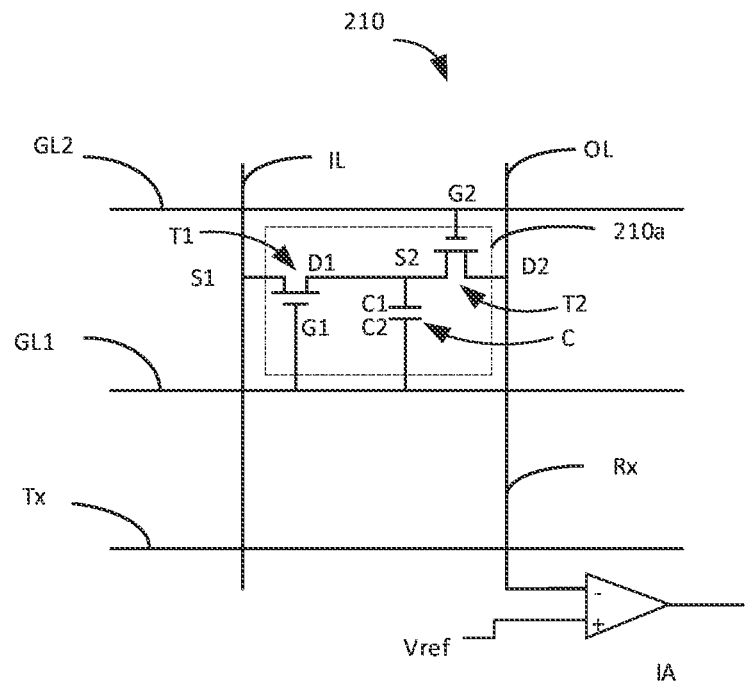
FIG. 8 is an equivalent circuit diagram of a control unit in FIG. 2.

Referring to FIGS. 4 and 8 together, the light control structure 20a includes a first scan line GL1, a second scan line GL2, a signal input line IL, and a signal output line (readout line) OL, and a photosensitive circuit 210a connected between the signal input line IL and the signal output line (readout line) OL. A signal input terminal of the photosensitive circuit 210a is connected to the signal input line IL, and a signal output terminal is connected to the signal output line OL. The first scan line GL1 and the second scan line GL2 extend along the first direction D1 and are arranged at intervals in the second direction D2. The signal input line IL and the signal output line OL extend along the second direction D2 and are arranged at intervals in the first direction D1. The first direction D1 and the second direction D2 may be perpendicular to each other. The first scan line GL1, the second scan line GL2, the signal input line IL and the signal output line OL intersect to form a rectangle. In addition to the rectangle in the drawings, a shape enclosed by the first scan line GL1, the second scan line GL2, the signal input line IL, and the signal output line OL can also be one or more of triangles, rhombuses, hexagons, and octagons, to form a grid-like structure. An interval between the first scan line GL1 and the second scan line GL2 may range from 0.1 mm to 4 mm. An interval between the signal input line IL and the signal output line OL may also range from 0.1 mm to 4 mm.

The first gate G1 is connected to the first scan line GL1. The first source S1 is connected to the signal input line IL. The second gate G2 is connected to the second scan line GL2. The second source S2 is connected to the first drain D1 of the photosensitive transistor T1. The second drain D2 is connected to the signal output line OL. The first plate C1 of the storage capacitor C is connected the output terminal of the photosensitive transistor T1 and the input terminal of the switch transistor T2, that is, disposed between the first drain D1 and the second source S2. The second plate C2 is connected to the first scan line GL1. The signal output line OL is connected to an integrating amplifier IA. Specifically, the signal output line OL is connected to a negative electrode of the integrating amplifier IA, and a positive electrode of the integrating amplifier IA is provided with a reference voltage Vref.

Figure 9:
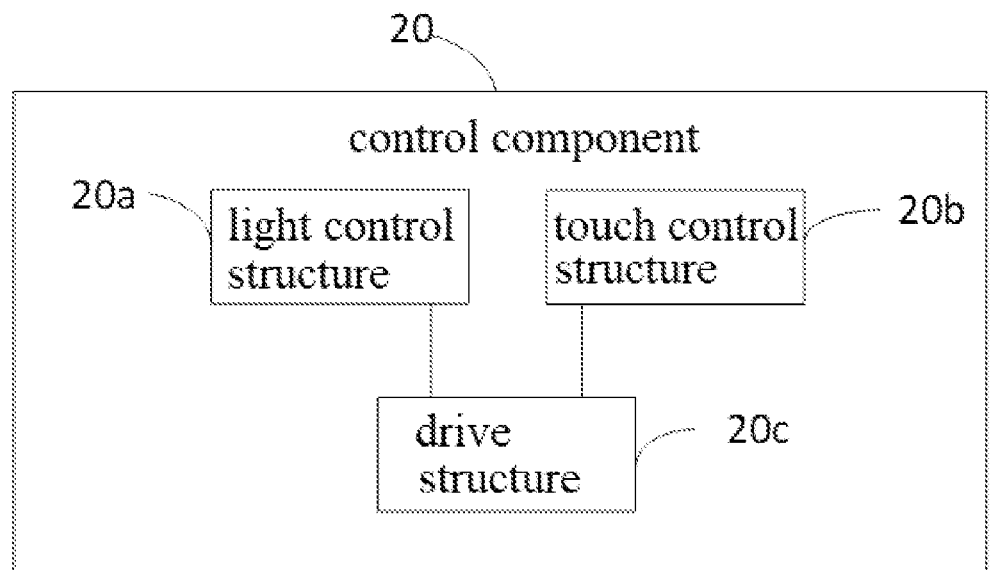
FIG. 9 is a schematic diagram of modules of a control component of a display screen provided by Embodiment 1 of the present application.

Referring to FIG. 9, the control component 20 further includes a drive structure 20c. The light control structure 20a and the touch control structure 20b are electrically connected to the drive structure 20c, and the drive structure 20c is configured to drive the light control structure 20a and the touch control structure 20b in a time-sharing manner. The drive structure 20c may include a driving chip (integrated circuit, IC). Therefore, the light control structure 20a and the touch control structure 20b can share the driving chip. The transmitting electrodes Tx and the signal input line IL of the light control structure 20a are electrically connected to the drive structure 20c.

Figure 10:
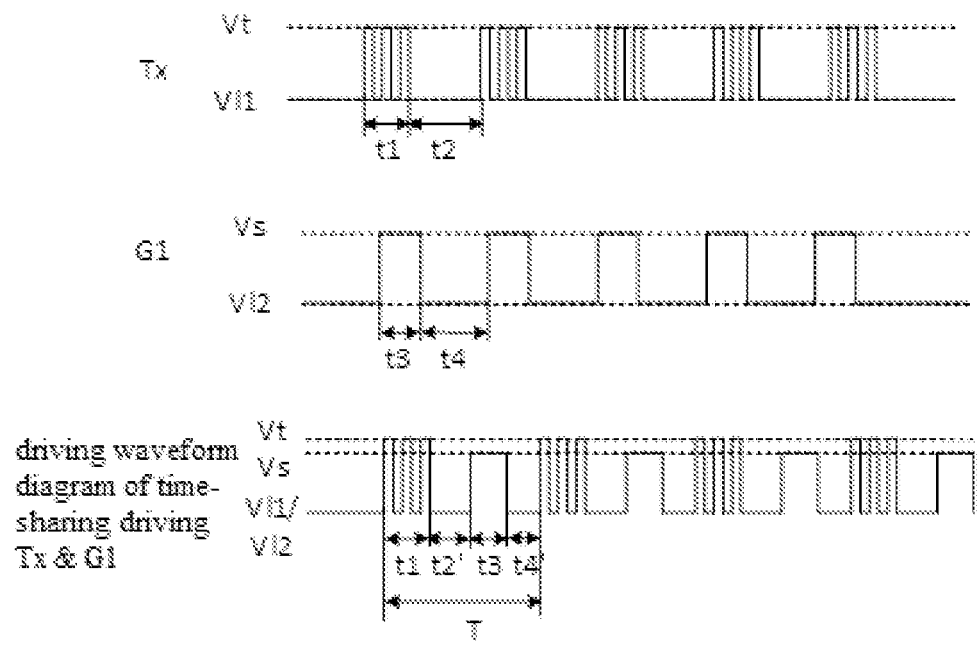
FIG. 10 is a driving waveform diagram of a control component of a display screen provided by an embodiment of the present application.

Referring to FIG. 10, the drive structure 20c drives the control component 20 of the display screen 100 in the following manner.

FIG. 10 from top to bottom are: a driving waveform diagram of driving the transmitting electrode Tx alone; a driving waveform diagram of driving the photosensitive transistor T1 alone; and a driving waveform diagram of time-sharing driving the transmitting electrode Tx and the photosensitive transistor T1.

When the transmitting electrode Tx is driven alone, in one driving cycle, in a first time period t1, a touch drive signal Vt is provided to the transmitting electrode Tx, and in a second time period t2, a first low level Vl1 is provided. When the photosensitive transistor T1 is driven alone, in one driving period, in the third time period t3, a scan driving signal Vs is provided to the first gate G1 of the photosensitive transistor T1, and in the fourth time period t4, a second low level Vl2 is provided.

When the transmitting electrode Tx and the photosensitive transistor T1 are time-sharing driven, a driving period T includes a first period t1, a second period t2', a third period t3, and a fourth period t4' in sequence. In the first time period t1, a touch driving signal Vt is provided to the transmitting electrode Tx. In the second time period t2', a first low level Vl1 is provided to the transmitting electrode Tx. The first low level may be 0V. In the third time period t3, a scan driving signal Vs is provided to the first gate G1 of the photosensitive transistor T1, and in the fourth time period t4', a second low voltage Vl2 is provided to the first gate G1 of the photosensitive transistor T1. The second low level Vl2 may be 0V. This driving method can be used for the control component of the present application, and the structure of the photosensitive circuit 210a is not particularly limited to, such as 1T, 1T1C, 2T1C circuits, etc.

In the present application, the working principle of the light control structure 20a is as follows: when a user operates an external light-emitting element to control the display screen 100, the light emitted by the external light-emitting element irradiates the light control structure 20a to make the amorphous silicon in the photosensitive transistor T1 to generate carriers, which is collected by the storage capacitor C, and then controlled by the switch transistor T2, processed by the integrating amplifier IA, and detected by the driving IC of the drive structure 20c, thereby determining the light irradiation position. The working principle of the touch control structure 20b is as follows: when a user touches the display screen 10, a projected capacitance between the transmitting electrode Tx and the receiving electrode Rx will change, and it will be detected by the driving chip after processing by the integrating amplifier IA. According to the detected electric signal, positions where the user touches can be determined. The signal output line OL in the light control structure 20a is time-sharing multiplexed with the receiving electrode Rx in the touch structure 20b. When a sensor receives a touch signal or a photosensitive signal, a charge variation generated thereby can be transmitted through the signal output line OL, and processed by an integration amplifier IA, which can accurately locate a coordinate position of a touch or a coordinate position of light-sensing.

In one embodiment, the resolutions of the light control structure 20a and the touch structure 20b are the same, that is, the smallest unit of the light control structure 20a corresponds to the smallest unit of the touch structure 20b one to one. In another embodiment, the resolutions of the light control structure 20a and the touch structure 20b are different, that is, the smallest units of the light control structure 20a and the touch structure 20b are not in a one-to-one correspondence. For example, if a number of the minimum units of the light control structure 20a is greater than a number of the minimum units of the touch structure 20b, only part of the signal output lines OL of the photosensitive circuit 210a is multiplexed as the receiving electrode Rx, and part of the signal output lines OL is not connected to the touch structure 20b. Alternatively, the number of the smallest units of the light control structure 20a is less than the number of the smallest units of the touch structure 20b, only part of the receiving electrodes Rx is multiplexed as the signal output line OL of the photosensitive circuit 210a, and the other part of the receiving electrode Rx is not connected to the light control structure 20a.

Figure 11:
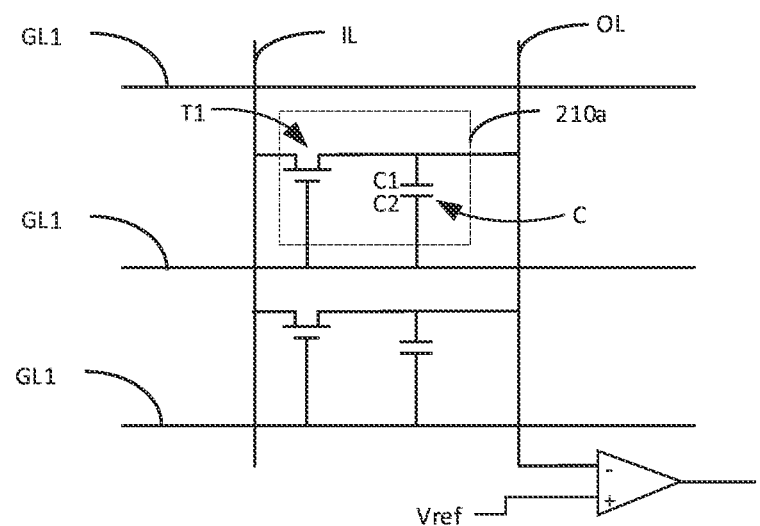
FIG. 11 is an equivalent circuit diagram of a control unit in the control device provided by the second embodiment of the present application.

Referring to FIG. 11, the control device 1 of this embodiment is substantially the same as the control device 1 of Embodiment 1, except the structure of the photosensitive circuit 210a of the light control structure. The photosensitive circuit 210a of this embodiment only includes a photosensitive transistor T1 and a storage capacitor C. The photosensitive transistor T1 is also used as a switch transistor. Specifically, the light control structure 20a includes a signal input line IL and a first scan line GL1, the first gate G1 of the photosensitive transistor T1 is connected to the first scan line GL1, the first source S1 of the photosensitive transistor T1 is connected to the signal input line IL, and the first drain D1 of the photosensitive transistor T1 is connected to the receiving electrode Rx. The first plate C1 of the storage capacitor C is connected to the output terminal of the photosensitive transistor T1, that is, the first drain D1 and the second plate C2 are connected to the first scan line GL1.

In addition, in another embodiment of the present application, the storage capacitor C may also be omitted, and the photosensitive circuit 210a is composed of only one photosensitive transistor T1.

The present application uses an on-glass structure integrated with a light control structure and a touch control structure, such that both the light control and touch functions can be simultaneously integrated into the display screen to realize the functions of short-range touch and remote light control, and lack of the single-function touch or light control is made up for. It is particularly conducive to the simultaneous realization of light control and touch functions of a large-size display screen. In addition, the signal output lines and receiving electrodes in the light control sensor and the touch sensor are combined and time-sharing multiplexed, which can simplify the structure of the display screen and reduce the cost.

In addition, the light control structure and the touch control structure are driven by the same drive structure, which facilitates the integration of light control chip and the touch control chip, and makes it easier to bind the integrated control component and the display panel together, thus simplifying the structure and save the manufacturing process.

The embodiments of the present application are described in detail above. Specific examples are used to explain the principle and implementation of the present application. The descriptions of the above embodiments are only used to help understand the present application. Also, for those skilled in the art, according to the ideas of the present application, there will be changes in the specific implementation and application scope. In summary, the content of this specification should not be construed as limiting the present application.

What is claimed is:

1. A control component, wherein the control component is integrated in a display screen and comprises a substrate and a light control structure and a touch control structure arranged side by side on the substrate; the light control structure comprises a signal input line, a signal output line, and a photosensitive circuit electrically connected between the signal input line and the signal output line; the touch control structure comprises a plurality of receiving electrodes and a plurality of transmitting electrodes; and the receiving electrodes are multiplexed as the signal output line;

wherein the photosensitive circuit comprises a photosensitive transistor; the light control structure comprises a first gate, a first source, a first drain, and a first active layer corresponding to the first gate and disposed between the first source and the first drain; the photosensitive circuit comprises a first scan line; the first gate is connected to the first scan line; and the first source is connected to the signal input line; and wherein a voltage is provided to the first gate, and the first drain of the photosensitive transistor is connected to the signal output line.

2. The control component according to claim 1, wherein the photosensitive circuit further comprises a switch transistor; a light control structure further comprises a second scan line; and the switch transistor comprises a second gate, a second source, a second drain, and a second active layer corresponding to the second gate and disposed between the second source and the second drain; the second gate is connected to the second scan line; the second source is connected to the first drain; and the second drain is connected to the signal output line.

3. The control component according to claim 2, wherein the transmitting electrodes and the second gate are arranged in a same layer, and the receiving electrodes and the second drain are arranged in a same layer.

4. The control component according to claim 2, wherein the first active layer and the second active layer are arranged in a same layer and made of a same material, and a material of each of the first active layer and the second active layer comprises a photosensitive semiconductor, and the switch transistor further comprises a light-shielding layer arranged on a side of the second active layer away from the substrate and corresponding to the second active layer.

5. A display screen, comprising a display panel and a control component attached to a display side of the display panel, wherein the control component is the control component according to claim 1.

6. The control component according to claim 2, wherein the photosensitive circuit further comprises a storage capacitor, a first plate of the storage capacitor is connected between the first drain and the second source, and the second electrode plate is connected to the first scan line.

7. The control component according to claim 4, wherein the light control structure comprises the first electrode layer disposed on the substrate, a semiconductor layer disposed on the first electrode layer, a second electrode layer disposed on the semiconductor layer, and the light-shielding layer disposed on the semiconductor layer; the transmitting electrodes are disposed in a same layer as one of the first electrode layer, the second electrode layer, and the light-shielding layer; and the receiving electrodes are disposed in a same layer as another one of the first electrode layer, the second electrode layer, and the light-shielding layer.

8. The control component according to claim 1, wherein the control component further comprises a drive structure, the light control structure and the touch control structure are electrically connected to the drive structure, and the drive structure is configured to time-sharing drive the light control structure and the touch control structure.

9. The control component according to claim 5, wherein the photosensitive circuit further comprises a storage capacitor, a first plate of the storage capacitor is connected to the first drain, and a second plate is connected to the first scan line.

10. The display screen according to claim 5, wherein the photosensitive circuit comprises a photosensitive transistor; the light control structure comprises a first gate, a first source, a first drain, and a first active layer corresponding to the first gate and disposed between the first source and the first drain; the photosensitive circuit comprises a first scan line; the first gate is connected to the first scan line; and the first source is connected to the signal input line.

11. The display screen according to claim 10, wherein the first drain of the photosensitive transistor is connected to the signal output line.

12. The display screen according to claim 10, wherein the photosensitive circuit further comprises a switch transistor; a light control structure further comprises a second scan line; and the switch transistor comprises a second gate, a second source, a second drain, and a second active layer corresponding to the second gate and disposed between the second source and the second drain; the second gate is connected to the second scan line; the second source is connected to the first drain; and the second drain is connected to the signal output line.

13. The display screen according to claim 12, wherein the transmitting electrodes and the second gate are arranged in a same layer, and the receiving electrodes and the second drain are arranged in a same layer.

14. The display screen according to claim 12, wherein the first active layer and the second active layer are arranged in a same layer and made of a same material, and a material of each of the first active layer and the second active layer comprises a photosensitive semiconductor, and the switch transistor further comprises a light-shielding layer arranged on a side of the second active layer away from the substrate and corresponding to the second active layer.

15. The display screen according to claim 5, wherein the photosensitive circuit further comprises a storage capacitor, a first plate of the storage capacitor is connected to the first drain, and a second plate is connected to the first scan line.

16. The display screen according to claim 12, wherein the photosensitive circuit further comprises a storage capacitor, a first plate of the storage capacitor is connected between the first drain and the second source, and the second electrode plate is connected to the first scan line.

17. The display screen according to claim 14, wherein the light control structure comprises the first electrode layer disposed on the substrate, a semiconductor layer disposed on the first electrode layer, a second electrode layer disposed on the semiconductor layer, and the light-shielding layer disposed on the semiconductor layer; the transmitting electrodes are disposed in a same layer as one of the first electrode layer, the second electrode layer, and the light-shielding layer; and the receiving electrodes are disposed in a same layer as another one of the first electrode layer, the second electrode layer, and the light-shielding layer.

18. A control device, comprising the display screen according to claim 5 and a light-emitting component, the light-emitting component is configured to emit light to the display screen, and the control component of the display screen is configured to detect a position where the light emitted by the light-emitting component enters the display screen.

* * * * *